(12) United States Patent
Yao et al.

(10) Patent No.: US 8,465,902 B2
(45) Date of Patent: Jun. 18, 2013

(54) UNDERLAYER COATING COMPOSITION AND PROCESSES THEREOF

(75) Inventors: Huirong Yao, Plainsboro, NJ (US); Zachary Bogusz, Belmar, NJ (US); Guanyang Lin, Whitehouse Station, NJ (US); Mark Neisser, Whitehouse Station, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 98 days.

(21) Appl. No.: 13/023,291

(22) Filed: Feb. 8, 2011

(65) Prior Publication Data

US 2012/0202155 A1 Aug. 9, 2012

(51) Int. Cl.
*G03F 7/00* (2006.01)
*G03F 7/004* (2006.01)
*G03F 7/028* (2006.01)

(52) U.S. Cl.
USPC ............ 430/270.1; 430/271.1; 430/913; 430/927

(58) Field of Classification Search
USPC ................ 430/270.1, 271.1, 913, 927
See application file for complete search history.

(56) References Cited

U.S. PATENT DOCUMENTS

| | | | |
|---|---|---|---|
| 3,474,054 A | 10/1969 | White | |
| 4,200,729 A | 4/1980 | Calbo | |
| 4,251,665 A | 2/1981 | Calbo | |
| 4,491,628 A | 1/1985 | Ito et al. | |
| 5,187,019 A | 2/1993 | Calbo et al. | |
| 5,350,660 A | 9/1994 | Urano et al. | |
| 5,843,624 A | 12/1998 | Houlihan et al. | |
| 6,447,980 B1 | 9/2002 | Rahman et al. | |
| 6,723,488 B2 | 4/2004 | Kudo et al. | |
| 6,790,587 B1 | 9/2004 | Feiring et al. | |
| 6,818,258 B2 | 11/2004 | Kaneko et al. | |
| 6,849,377 B2 | 2/2005 | Feriring et al. | |
| 6,866,984 B2 | 3/2005 | Jung et al. | |
| 6,916,590 B2 | 7/2005 | Kaneko et al. | |
| 7,019,045 B2 * | 3/2006 | Tsuihiji et al. | 522/164 |
| 7,214,743 B2 * | 5/2007 | Hatakeyama et al. | 525/534 |
| 7,264,913 B2 | 9/2007 | Wu et al. | |
| 7,476,485 B2 * | 1/2009 | Hatakeyama et al. | 430/270.1 |
| 7,638,262 B2 | 12/2009 | Wu et al. | |
| 7,691,556 B2 | 4/2010 | Wu et al. | |
| 7,736,822 B2 * | 6/2010 | Hashimoto et al. | 430/5 |
| 8,088,554 B2 * | 1/2012 | Hatakeyama | 430/270.1 |

(Continued)

FOREIGN PATENT DOCUMENTS

| | | | |
|---|---|---|---|
| EP | 1939688 A1 * | 7/2008 | |
| JP | 2001215689 A * | 8/2001 | |
| WO | WO 2008139320 A2 * | 11/2008 | |

OTHER PUBLICATIONS

Roel Gronheid et al., "EUV Resist Requirements: Absorbance and Acid Yield", SPIE vol. 7273, pp. 727332-1-pp. 727332-8 (2009).

(Continued)

*Primary Examiner* — Amanda C. Walke
(74) *Attorney, Agent, or Firm* — Sangya Jain

(57) ABSTRACT

The invention relates to an underlayer coating composition comprising a polymer, where the polymer comprises at least one hydroxyaromatic unit in the backbone of the polymer phenol which has a pendant group comprising a fluoro or iodo moiety, and at least one unit comprising an aminoplast. The invention further relates to a process for forming an image using the composition, especially for EUV.

20 Claims, 7 Drawing Sheets

Examples of the phenolic monomer

U.S. PATENT DOCUMENTS

| | | | |
|---|---|---|---|
| 2004/0259037 A1* | 12/2004 | Hatakeyama et al. | 430/312 |
| 2008/0206680 A1* | 8/2008 | Kishioka et al. | 430/313 |
| 2008/0286689 A1 | 11/2008 | Zhuang et al. | |
| 2009/0042133 A1 | 2/2009 | Xiang et al. | |
| 2009/0117493 A1 | 5/2009 | Kishioka et al. | |
| 2010/0009297 A1 | 1/2010 | Yao et al. | |
| 2010/0119980 A1* | 5/2010 | Rahman et al. | 430/313 |
| 2011/0104613 A1 | 5/2011 | Yao et al. | |

OTHER PUBLICATIONS

Douglas J. Guerrero et al., "Organic Underlayers for EUV Lithography", Journal of Photopolymer Science and Technology, vol. 21, No. 3, pp. 451-pp. 455 (2008).

Douglas J. Guerrero et al., "Underlayer Designs to Enhance EUV Resist Performance", Journal of Photopolymer Science and Technology, vol. 22, No. 1, pp. 117-pp. 122 (2009).

Craig Higgins et al., "Understanding Ultra-Thin Film Resist and Underlayer Performance through Physical Characterization", Journal of Photopolymer Science and Technology, vol. 23, No. 5, pp. 699-pp. 707 (2010).

Jeanette M. Roberts et al., "Sensitivity of EUV resists to out-of-band radiation", SPIE vol. 7273, pp. 72731W-1-pp. 72731W-13 (2009).

Hao Xu et al., "Underlayer designs to enhance the performance of EUV resists", SPIE vol. 7273, pp. 73731J-1-pp. 72731J-11 (2009).

Form PCT/ISA/220, IForm PCT/ISA/210, and Form PCT/ISA/237 dated May 9, 2012 for PCT/IB2012/000213, which corresponds to U.S. Appl. No. 13/023,291.

* cited by examiner

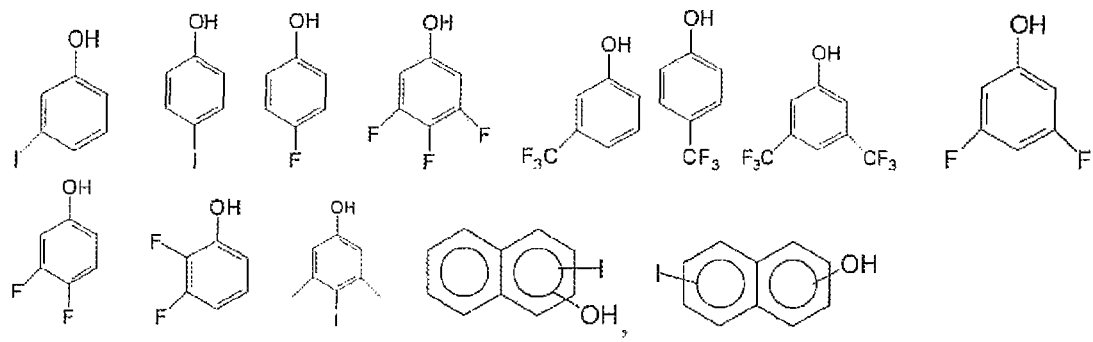
Figure 1: Examples of the phenolic monomer
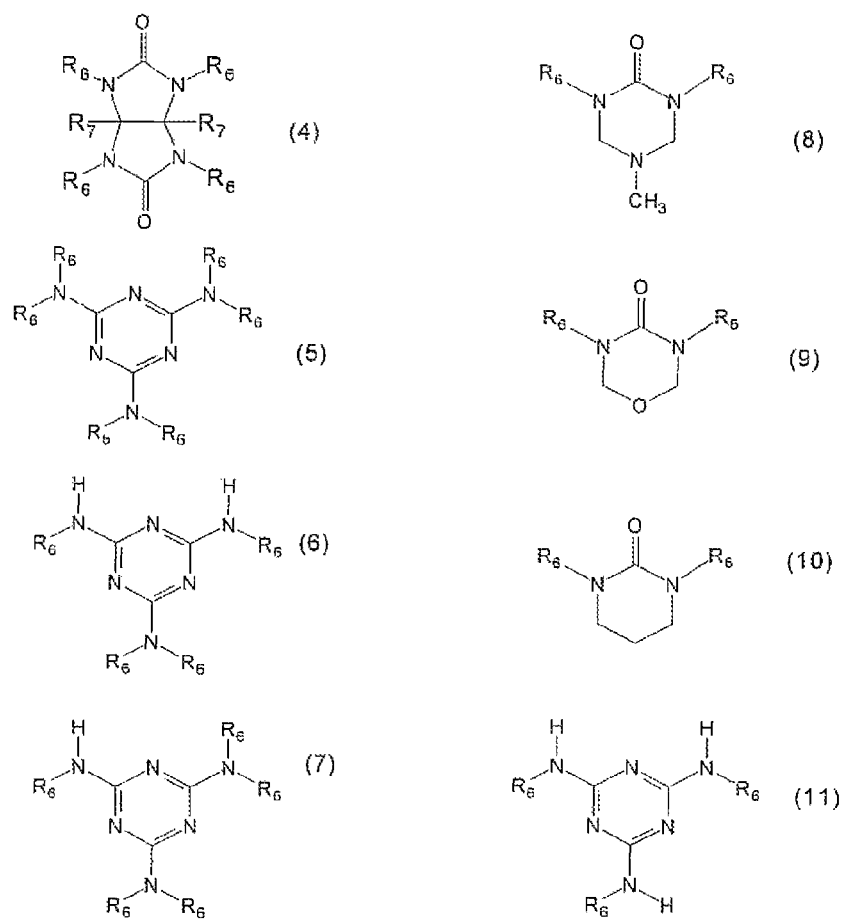
Figure 2: Examples of aminoplast monomer of structures 4-11

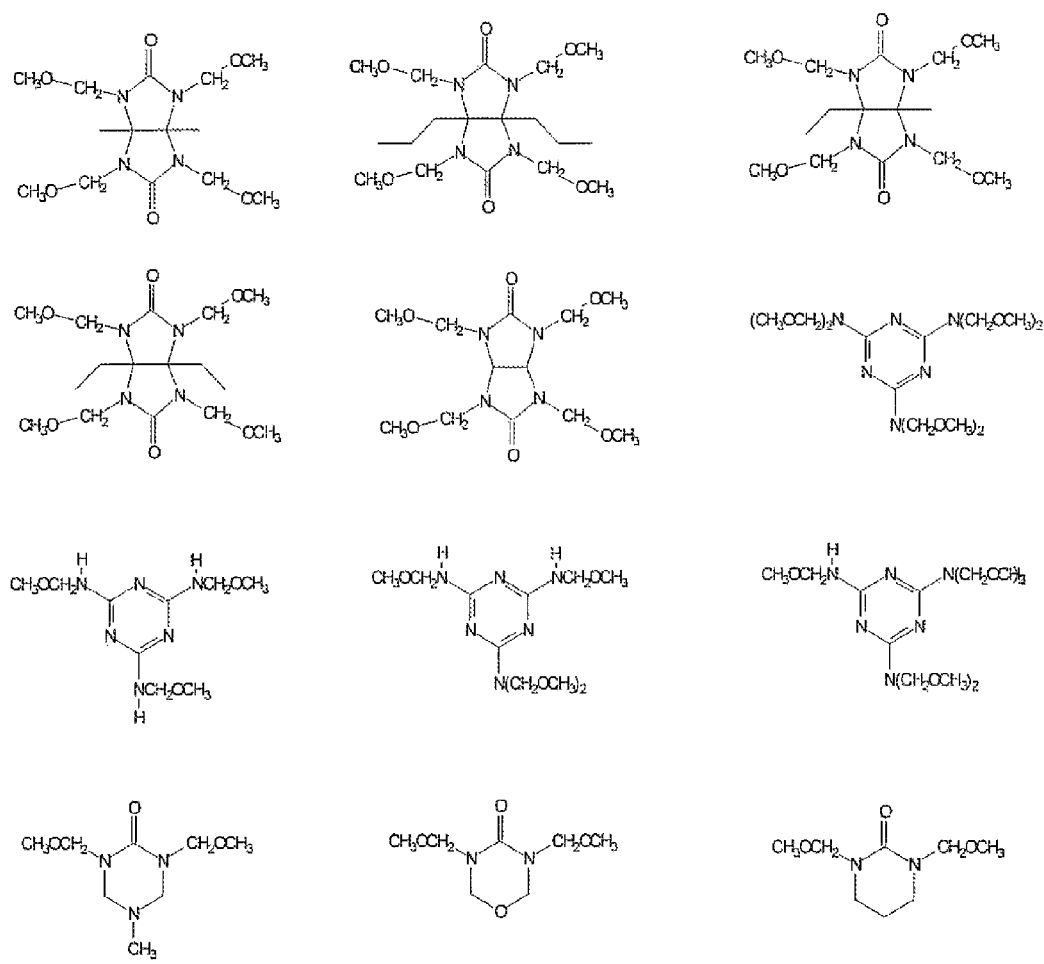
Figure 3: Specific examples of aminoplasts

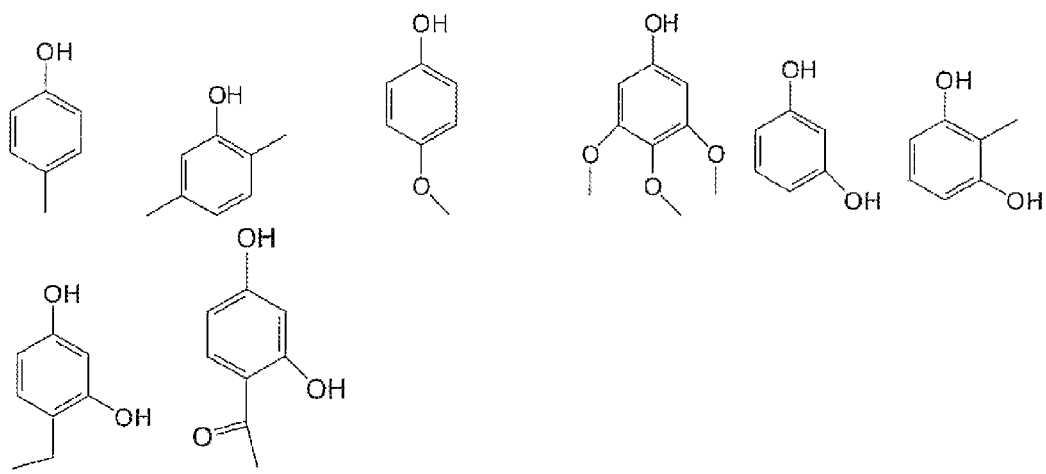
Figure 4: Examples of phenolic comonomers

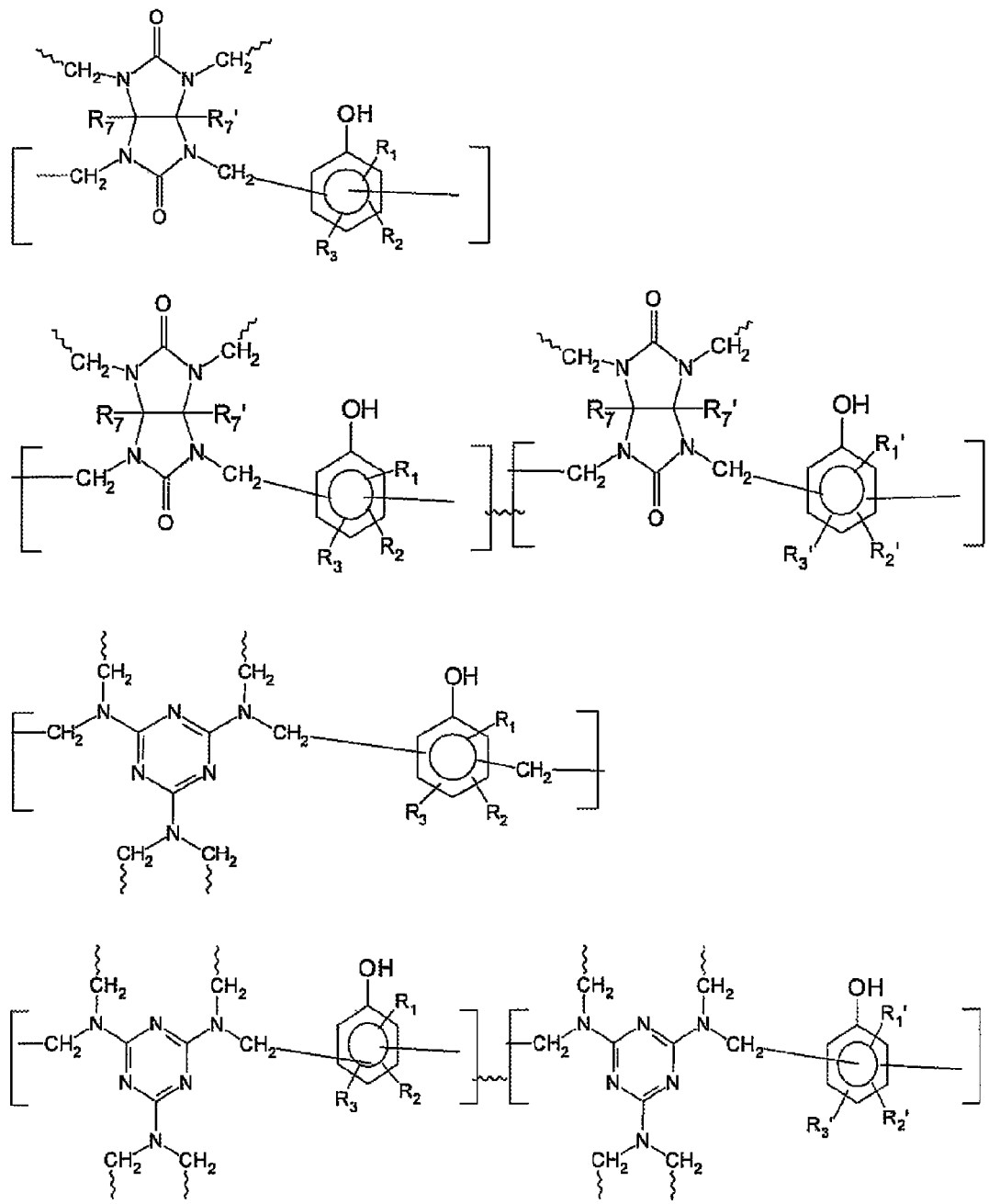
Figure 5: Examples of Novel Polymer

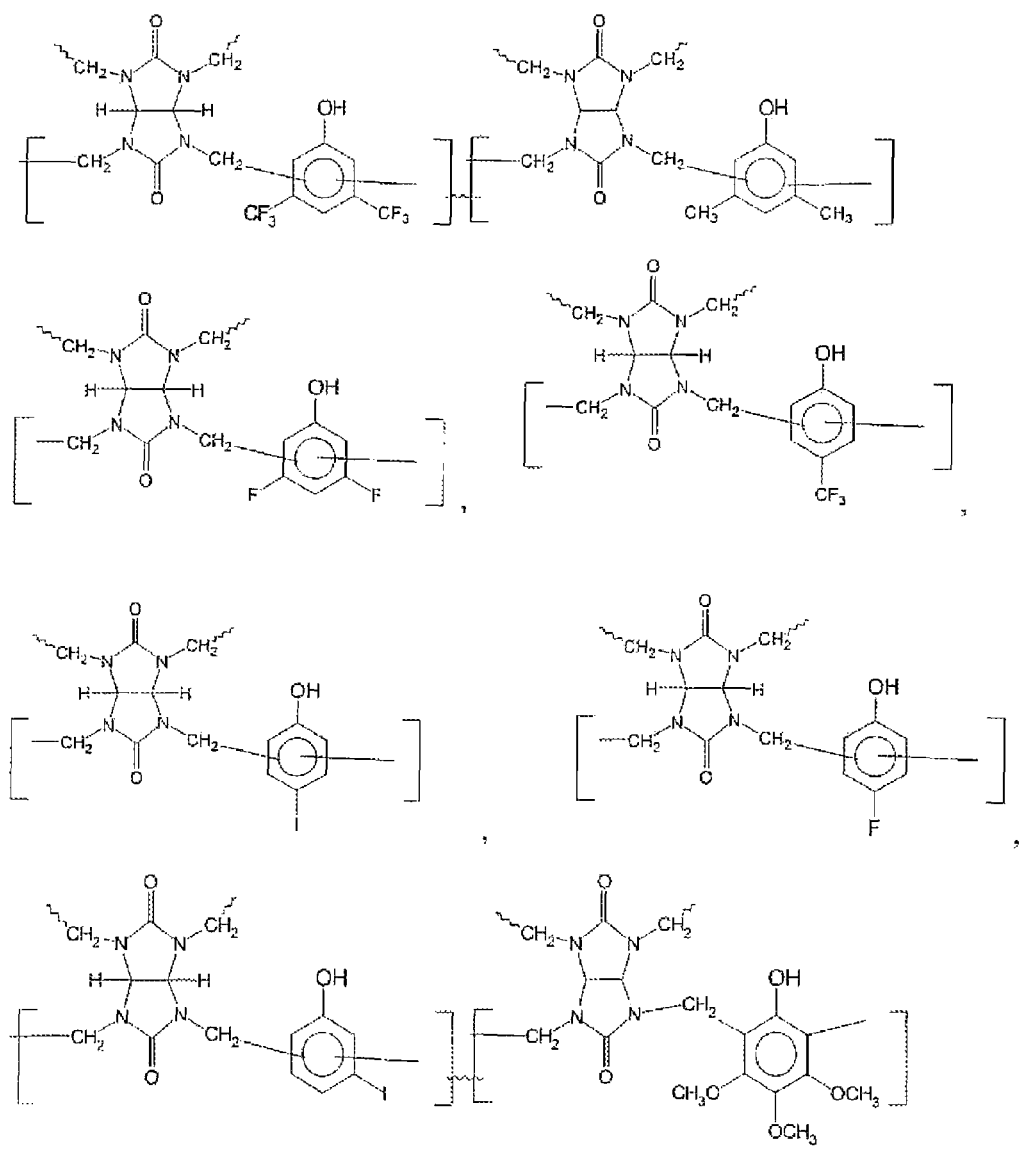
Figure 6 Specific examples of Novel Polymer

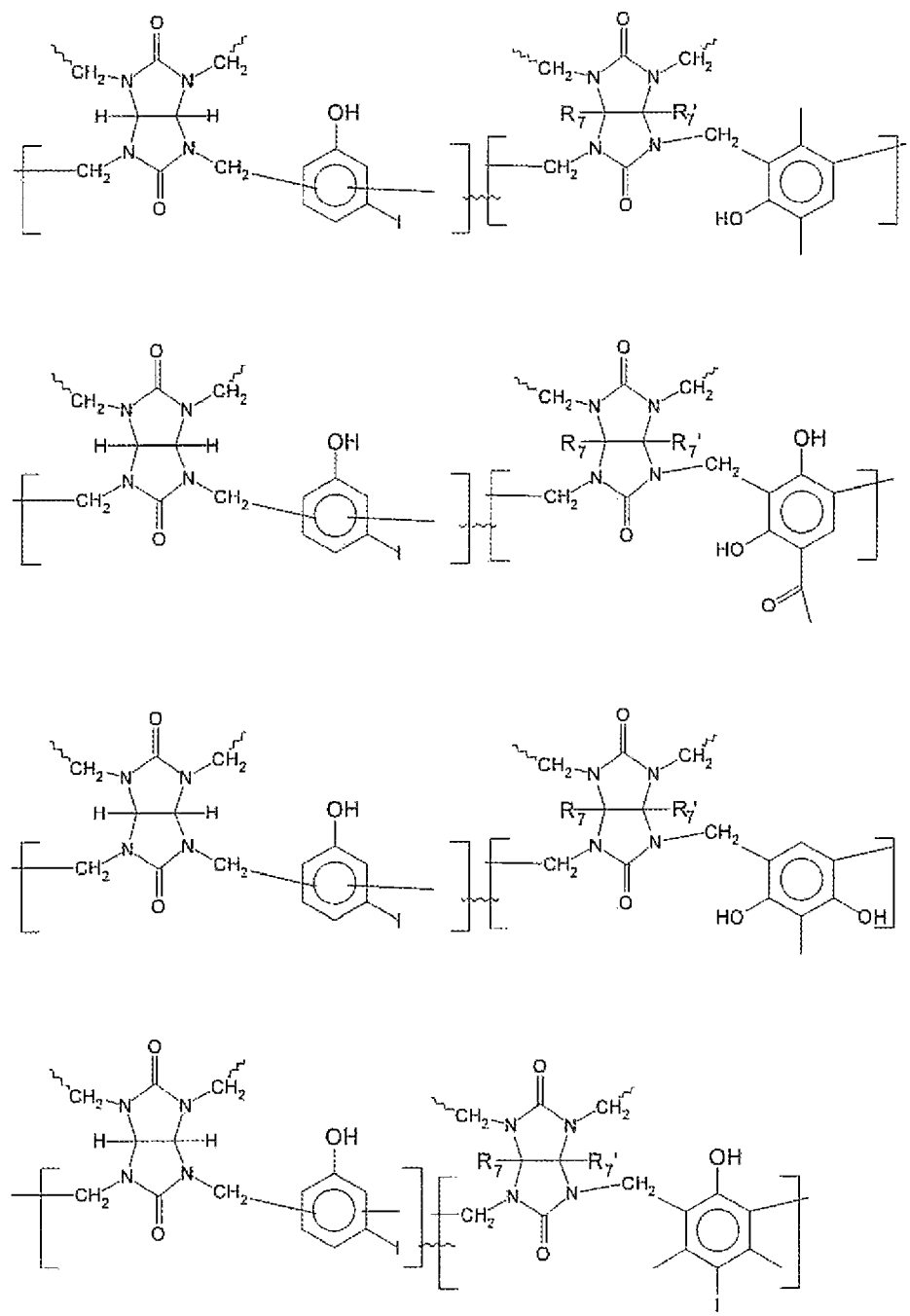
Figure 7: More Specific examples of Novel Polymer

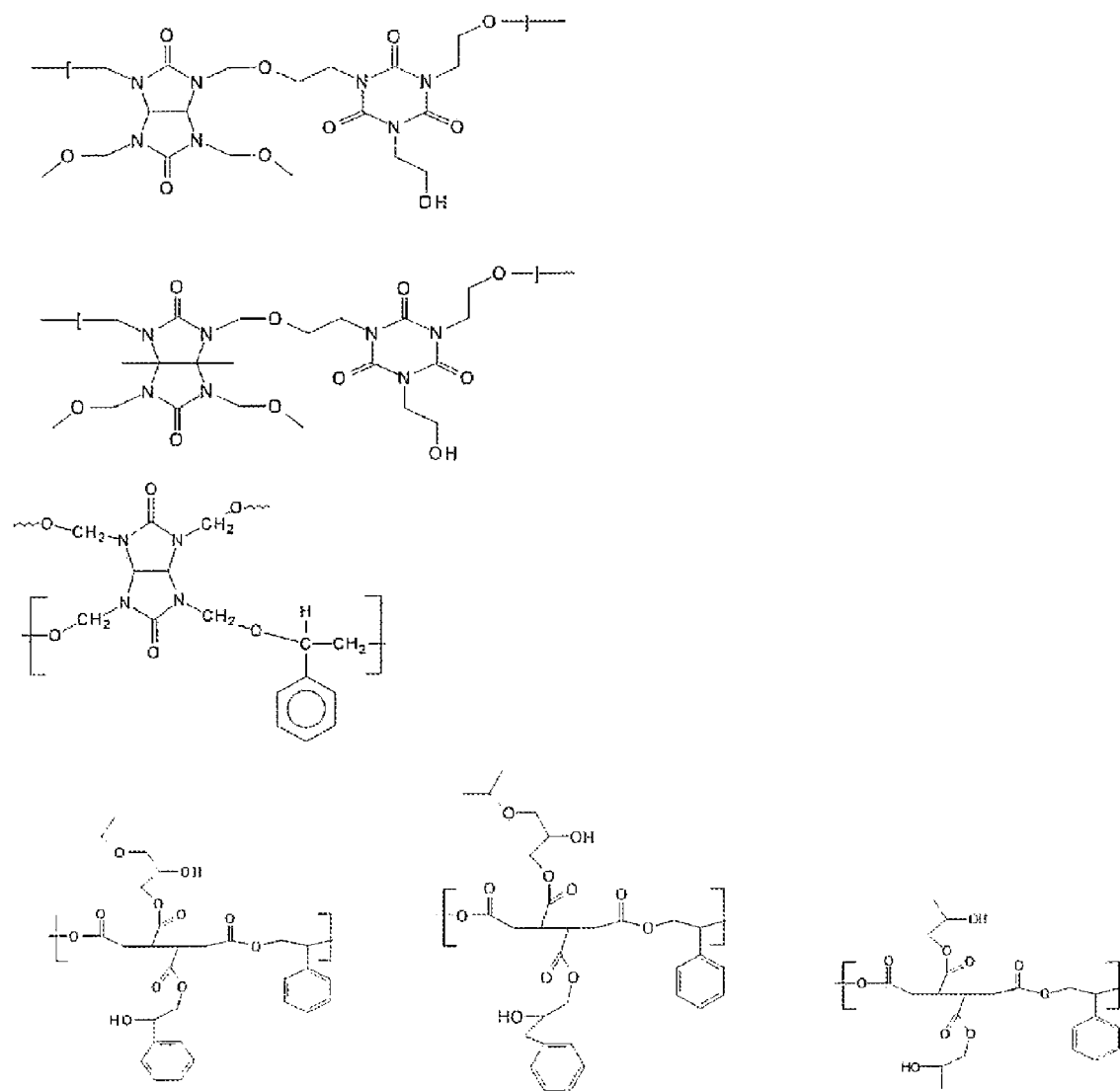
Figure 8: Examples of secondary polymer

UNDERLAYER COATING COMPOSITION AND PROCESSES THEREOF

The present invention relates to an absorbing underlayer coating composition comprising a polymer, where the polymer comprises at least one aminoplast group and in the backbone of the polymer at least a substituted or unsubstituted hydroxyaromatic with pendant fluoro or iodo moiety. The invention also relates to a process for forming an image using the absorbing underlayer composition. The process is especially useful for imaging photoresists using radiation in the deep ultraviolet, 100-260 nm (DUV) and extreme ultraviolet, 13.5 nm (EUV) region.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon based wafers used for making integrated circuits. The coated substrate is then baked to evaporate any solvent in the photoresist composition. The baked coated surface of the substrate is next subjected to an image-wise exposure to radiation.

This radiation exposure causes a chemical transformation in the exposed areas of the coated surface. Ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

Recently, extreme ultraviolet (EUV) lithography using 13.5 nm exposure radiation has evolved as a possible technology for obtaining photoresist patterns with 22 nm half pitch mode. However, issues related to line edge roughness and sensitivity present in EUV photoresist lithography have led to the use of an absorbing underlayer as a method of overcoming such deficiencies. Since ultrathin photoresist films have been used for EUV lithography, especially for chemically amplified photoresists, the use of absorbing underlayers coated between the photoresist and the substrate is a very desirable technique for improving the lithographic performance of the photoresist. The EUV exposure source comprises not only the predominant 13.5 nm radiation but also smaller components of out of band deep uv radiation in the range of 140 nm to 300 nm, and more so 160 nm to 260 nm. It is desirable that the underlayer absorb not only 13.5 nm radiation but also the out of band radiations.

Absorbing antireflective coatings or underlayers in photolithography are used to diminish problems that result from back reflection of light from highly reflective substrates. An antireflective coating coated beneath a photoresist and above a reflective substrate provides significant improvement in lithographic performance of the photoresist. Typically, the underlayer coating is applied on the substrate and then a layer of photoresist is applied on top of the antireflective coating. The underlayer coating is cured to prevent intermixing between the antireflective coating and the photoresist. The photoresist is exposed imagewise and developed. The antireflective coating in the exposed area is then typically dry etched using various etching gases, and the photoresist pattern is thus transferred to the substrate. Multiple antireflective layers and underlayers are being used in new lithographic techniques.

The present invention relates to a novel organic spin coatable underlayer composition which is capable of absorbing the radiation used to expose the photoresist and reducing substrate reflection. The film formed from the novel composition is placed between a photoresist layer and the substrate and forms an EUV underlayer and/or deep uv antireflective film. The novel composition is useful for imaging photoresists, and also for possibly forming a mask for etching the substrate. The novel composition enables a good image transfer from the photoresist to the substrate, and also reduces reflections and enhances pattern transfer. Additionally, substantially no intermixing is present between the antireflective coating and the film coated above it. The antireflective coating also has good solution stability and forms films with good coating quality, the latter being particularly advantageous for lithography. The novel composition forms a film which has low out-gassing, has good planarization property, protects the substrate from possible damaging EUV radiation, prevents contamination from substrate poisoning, has good adhesion and improved etch selectivity.

SUMMARY OF THE INVENTION

The present invention relates to an underlayer coating composition comprising a polymer, where the polymer comprises at least one hydroxyaromatic unit in the backbone of the polymer comprising a fluoro or iodo moiety, and at least one unit comprising an aminoplast. The invention further relates to a process of imaging the novel composition.

BRIEF DESCRIPTION OF DRAWINGS

FIG. 1 illustrates examples of the absorbing hydroxyaromatic monomer.

FIG. 2 shows examples of aminoplast monomer of structures 4-11.

FIG. 3 shows specific examples of aminoplasts.

FIG. 4 illustrates examples of phenolic comonomers.

FIG. 5 shows examples of the novel polymer.

FIG. 6 shows specific examples of the novel polymer.

FIG. 7 shows more specific examples of the novel polymer.

FIG. 8 shows examples of secondary polymer.

DETAILED DESCRIPTION OF THE INVENTION

The present invention relates to an absorbing underlayer coating composition comprising a novel polymer capable of crosslinking, where the polymer comprises at least one hydroxyaromatic unit (A) in the backbone of the polymer which has a group comprising a fluoro or iodo moiety pendant from the hydroxyaromatic moiety, and at least one unit (B) comprising an aminoplast. The hydroxyaromatic moiety may be further substituted. The novel polymer may be self-crosslinkable. The invention also relates to a process for imaging a photoresist layer coated above the novel antireflective coating layer for 12-300 nm radiation, especially for EUV lithography.

The novel antireflective composition of the present invention comprises a novel polymer which is capable of absorbing EUV radiation efficiently and is capable of crosslinking, such that the coating, formed from the composition after crosslinking, becomes insoluble in the solvent of the material coated above it. The polymer of the novel coating composition is capable of self-crosslinking or the composition may additionally comprise an external crosslinking compound capable of crosslinking with the novel polymer. The composition may optionally comprise other additives, such as thermal acid generators, photoacid generators, surfactants other secondary polymers, etc. The composition may comprise additional secondary polymers, especially those which increase the etch rate of the film or function as a crosslinker to crosslink with the novel polymer. The solid components of the novel composition are dissolved in an organic coating solvent composition, comprising one or more organic solvents. The novel polymer is soluble in the organic coating solvent(s).

The novel polymer of the novel composition comprises at least one unit (A) in the backbone of the polymer comprising a hydroxyaromatic group selected from a substituted phenol, unsubstituted phenol, substituted naphthol and unsubstituted naphthol, substituted hydroxyanthracene, unsubstituted hydroxyanthracene where the hydroxyaromatic group has a pendant group comprising a fluoro or iodo moiety, and at least one unit (B) comprising an aminoplast. Thus, the hydroxyaromatic unit (A) which is in the backbone of the polymer must have at least one fluoro or iodo moiety. The hydroxyaromatic unit may be further substituted with other groups such as an iodo moiety, a fluoro moiety, hydroxyl, $(C_1-C_4)$alkyl, hydroxy$(C_1-C_4)$alkyl $OC_1-C_4$alkyl, $(C=O)(C_1-C_4)$alkyl, $C_1-C_4$alkyl$O(C_1-C_4)$alkyl, $C_1-C_4$alkyl$(C=O)(C_1-C_4)$alkyl, and $C(O)O(C_1-C_4)$alkyl. An iodo moiety and fluoro moiety may be selected from I or F attached directly to the hydroxyaromatic moiety (such as phenol or naphthol), hydrocarbon containing iodine or fluorine, functionalized hydrocarbon containing iodine or fluorine, where the funtionalization is ether, keto, ester, etc. Examples of an iodo moiety and fluoro moiety are I, F, $C_1-C_4$fluoroalkyl, $C_1-C_4$ hydroxyfluoroalkyl, $OC_1-C_4$fluoroalkyl $C(O)(C_1-C_4)$fluoroalkyl, $C(O)O(C_1-C_4)$fluoroalkyl, etc., where the $C_1-C_4$fluoroalkyl is a hydrocarbon chain which may comprise only fluorine pendant from the carbon backbone or a mixture of fluorine and hydrogen pendant from the carbon backbone; further examples are I, F, $CF_3$, $C(O)$—$CF_3$, $CF_2CF_3$, $CF_2CHF_2$, $OCF_3$, $C(CF_3)_2OH$. Examples of other substutuents on the phenolic ring are F, I, $CH_3$, $C_2H_5$, OH, $CF_3$, $C(O)$—$CF_3$, $C(O)$—$CH_3$ etc.

The fluoro or iodo moiety of the polymer is capable of absorbing the EUV radiation efficiently. In the novel polymer a strong EUV absorbance is induced by attaching iodide or fluoride in close proximity to a secondary electron sensitizer such as the hydroxyaromatic, for example a phenol. The secondary electrons generated by the absorption can cause the formation of an acid from the photoacid generator in the photoresist and so further improve photoresist photosensitivity and pattern profile. The EUV absorbing antireflective underlayer may also help to reduce footing and scum at the photoresist/underlayer interface, also improve lithographic performance such as collapse margin and processing latitude, and protect photoresist from poisonous substrate such as from bases.

The unit (A) of the novel polymer may be of structure 1,

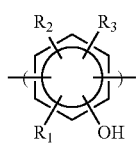

(1)

where, $R_1$ is selected from iodo moiety and fluoro moiety, $R_2$ and $R_3$ and independently selected from an iodo moiety, a fluoro moiety, hydrogen, hydroxyl, $(C_1-C_4)$alkyl, hydroxy $(C_1-C_4)$alkyl $OC_1-C_4$alkyl, $(C=O)(C_1-C_4)$alkyl, $C_1-C_4$alkyl$O(C_1-C_4)$alkyl, $C_1-C_4$alkyl$(C=O)(C_1-C_4)$alkyl, and $C(O)O(C_1-C_4)$alkyl and the like. An iodo moiety and fluoro moiety can be I, F or an organic group comprising at least one of I and F. The organic group comprising F may be selected from $C_1-C_4$fluoroalkyl, $C_1-C_4$ hydroxyfluoroalkyl, $OC_1-C_4$fluoroalkyl $C(O)(C_1-C_4)$fluoroalkyl, $C(O)O(C_1-C_4)$fluoroalkyl, etc., where the fluoroalkyl is a hydrocarbon chain which may comprise only fluorine pendant from the carbon backbone or a mixture of fluorine and hydrogen pendant from the carbon backbone; further examples of iodo moiety and fluoro moiety are I, F, $CF_3$, $C(O)$—$CF_3$, $CF_2CF_3$, $CF_2CHF_2$, $OCF_3$, $C(CF_3)_2OH$. Examples of $R_2$ and $R_3$ are independently H, F, I, $CH_3$, OH, $CF_3$, $C(O)$—$CF_3$, $C(O)$—$CH_3$, $C_2H_5$, $OCH_3$, $CH_2$ $OCH_3$, and $CH_2$ $C(O)$—$CH_3$. Specific examples for $R_1$ are I, F, and $CF_3$. Specific examples of $R_2$ and $R_3$ are I, F, $CF_3$, $CH_3$, OH, $C(O)$—$CH_3$, and $O$ $CH_3$. In one embodiment, $R_2$ and $R_3$ are connected to form aromatic ring fused to the phenol, to form a unit (A) which is naphthol or hydroxyanrthracene substituted with iodo moiety and fluoro moiety.

The monomer from which the unit with the phenolic unit (A) in the polymer backbone is derived may be described by structure (2) where $R_1$, $R_2$, and $R_3$ are as described previously.

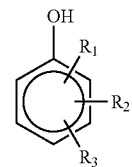

(2)

Specific examples of the monomer (2) which forms the phenolic unit in the backbone of the polymer are shown in FIG. 1.

The novel polymer of the present invention comprises the hydroxyaromatic unit (A) as described herein and a unit comprising an aminoplast (B). The aminoplast is capable of self-crosslinking the polymer or crosslinking with other polymers. In one embodiment, the composition comprising the novel polymer is capable of self-crosslinking and may be free of other external crosslinker compounds. The novel polymer is a condensation polymerization product of an aminoplast compound with the hydroxyaromatic compound comprising at least one fluorine or iodine group, in the presence of a catalytic amount of a strong acid such as toluenesulfonic acid. The aminoplast compound contains reactive aminomethylenealkoxy moieties (N—$CH_2$—O-alkyl), some of which react partially to form the novel polymer, and the other such moieties are present in the polymer to assist in crosslinking the film.

The aminoplast compound used in the reaction to obtain the novel polymer can comprise two or more alkoxy groups and can be based on aminoplast compounds such as, for example, glycoluril-aldehyde resins, melamine-aldehyde resins, benzoguanamine-aldehyde resins, and urea-aldehyde resins. Examples of the aldehyde include formaldehyde, acetaldehyde, etc. In some instances, three or four alkoxy groups are useful. Monbmeric, alkylated glycoluril-formaldehyde resins are an example. One example is tetra(alkoxyalkyl)glycoluril having the following structure (3),

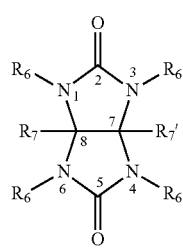

(3)

where each $R_6$ is $(CH_2)_n$—O—$(CH_2)_m$—$CH_3$, each $R_7$ and $R_{7'}$ are independently selected from hydrogen or $C_1$-$C_6$ alkyl, n is 1 to 4, and m is 0 to 3; the numbers in (3) indicating atom number for compound naming. Some examples of $R_6$ are $CH_2OCH_3$, $CH_2OC_2H_5$, and $CH_2OC_4H_9$. Examples of aminoplasts are such as those which are commercially available from Cytec Industries under the trademark CYMEL and from Monsanto Chemical Co. under the trademark RESIMENE. Condensation products of other amines and amides can also be employed, for example, aldehyde condensates of triazines, diazines, diazoles, guanidines, guanimines and alkyl- and aryl-substituted derivatives of such compounds, including alkyl- and aryl-substituted melamines. Some examples of such compounds are N,N'-dimethyl urea, benzourea, dicyandiamide, formaguanamine, acetoguanamine, amrneline, 2-chloro-4,6-diamino-1,3,5-triazine, 6-methyl-2,4-diamino, 1,3,5-traizine, 3,5-diaminotriazole, triaminopyrimidine,2-mercapto-4,6-diamino-pyrimidine, 3,4,6-tris(ethylamino)-1, 3,5-triazine, tris(alkoxycarbonylamino)triazine, N,N,N',N'-tetramethoxymethylurea and the like. Other possible aminoplast compounds are shown in FIG. 3, structures 4-11. Additional aminoplast monomers include their analogs and derivatives, such as etherified amino resins, for example methylated or butylated melamine resins (N-methoxymethyl- or N-butoxymethyl-melamine respectively) or methylated/butylated glycolurils. Various melamine and urea resins are commercially available under the Nicalacs (Sanwa Chemical Co.), Plastopal (BASF AG), or Maprenal (Clariant GmbH) tradenames may be used.

More specifically, the aminoplast may be selected from the group comprising of glycolurils having the Structure (3). Examples of glycolurils are tetra(alkoxymethyl)glycoluril, may include, e.g., tetra(methoxymethyl)glycoluril, tetra(ethoxymethyl)glycoluril, tetra(n-propoxymethyl)glycoluril, tetra(i-propoxymethyl)glycoluril, tetra(n-butoxymethyl)glycoluril, tetra(t-butoxymethyl)glycoluril, substituted tetra(alkoxymethyl)glycolurils such as 7-methyl tetra(methoxymethyl)glycoluril, 7-ethyl tetra(methoxymethyl)glycoluril, 7-(i- or n-)propyl tetra(methoxymethyl)glycoluril, 7-(i- or sec- or t-)butyl tetra(methoxymethyl)glycoluril, 7,8-dimethyl tetra(methoxymethyl)glycoluril, 7,8-diethyl tetra(methoxymethyl)glycoluril, or n-)propyl tetra(methoxymethyl)glycoluril, 7,8-di(i- or sec- or t-)butyl tetra(methoxymethyl)glycoluril, 7-methyl-8-(i- or n-)propyl tetra(methoxymethyl)glycoluril, and the like. Tetra(methoxymethyl)glycoluril is available under the trademark POWDERLINK from Cytec Industries (e.g., POWDERLINK 1174). Other examples include methylpropyltetramethoxymethyl glycoluril, and methylphenyltetramethoxymethyl glycoluril. FIG. 3 shows examples of specific aminoplast materials. Of the glycourils a tetramethoxymethylglycouril is an example of a more specific choice of an aminoplast compound.

The novel polymer may comprise unit (A), unit (B) and additional monomeric units. The additional units may be a monomer capable of polymerization with the other units. Examples of the monomer unit may be monomers comprising naphthyl, anthracyl, and phenyl and mixture thereof. Specific examples of the monomer used to form the additional unit are phenols, naphthol, anthracenemethanol and hydroxyanthracene.

The novel polymer may further comprise comonomeric unit(s) (C) other than (A) and (B), such as phenolics of structure (12). Structure 12 shows the structure of the optional second type of phenolic compound not containing or free of fluorine or iodine atoms where $R_{1'}$, $R_{2'}$, and $R_{3'}$, are independently chosen from the group consisting of H, hydroxyl, ($C_1$-$C_4$)alkyl, hydroxy($C_1$-$C_4$)alkyl, $OC_1$—$C_4$alkyl, (C=O)($C_1$-$C_4$)alkyl, $C_1$-$C_4$alkylO($C_1$-$C_4$)alkyl, $C_1$-$C_4$alkyl(C=O)($C_1$-$C_4$)alkyl, and C(O)O($C_1$-$C_4$)alkyl.

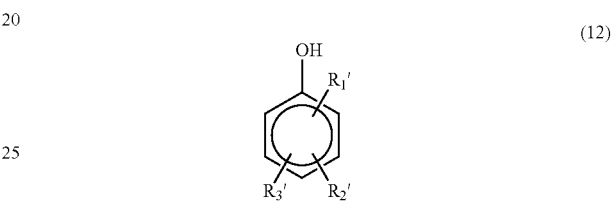

(12)

Specific examples of the phenol of structure (12) that may be employed are given in FIG. 4. Specific examples of $R_{1'}$, $R_{2'}$, and $R_{3'}$ are independently H, $CH_3$, OH, $C_2H_5$, $OCH_3$, C(O)—$CH_3$, $CH_2$ $OCH_3$, $CH_2$ C(O)—$CH_3$.

Some examples of the novel polymer are further illustrated by FIGS. 5-7.

The polymer of the present novel composition may be synthesized by reacting the monomers in the presence of a solvent and an acid catalyst. The polymer is typically recovered by precipitation into water and then dried. When making such polymers a molar ratio of aminoplast (monomer of B) to iodo or fluro phenol (monomer of A) of 3:1 to 1:2 or 2:1 to 1:1 molar ratio may be employed. An optional second phenolic compound not having fluoro or iodo containing substituent may also be used in the polymerization. This second phenolic compound (monomer of C) can be present in a range of 0 to 100 mole % relative to the fluoro or iodo containing phenol, or 10-80 mole % or 30-60 mole %. Typically the. low molecular weight portion is removed. Previously known techniques of reacting, isolating and purifying the polymer may be used. The weight average molecular weight of the polymer can range from about 1000 to about 25,000, or about 1500 to about 15000.

The refractive indices of the polymer, n (refractive index) and k (absorption) can range from about 1.3 to about 2.0 for the refractive index and about 0.05 to about 1.0 for the absorption at 193 nm exposure wavelength, since the novel polymer has absorption at 193 nm and the techniques to measure n and k values are not yet refined for 13.5 nm measurement. The iodo or fluoro content of the polymer or of the composition can be determined by elemental analysis of the solid polymer or composition. The fluoro or iodo content of the polymer can range from 1% to 65% by weight, or 2% to 35% relative to the polymer. The fluoro content of the polymer can range from 1% to 20%, or 5-15% by wt % relative to the polymer. The iodo content of the polymer can range from 5-65%, or 10-35% by wt % relative to the polymer. The EUV absorption may be calculated to be greater than 1.5/g or in the range of 1.5/g to 20/g, or 1.5/g to 10/g, based on elemental analysis of the polymer, by assigning a known atomic absorption value given in literature to each atom in the polymer.

Other polymers may be added to the composition, such as polymers that enhance crosslinking, polymers that increase the etch rate of the film, etc. These secondary polymers if present in the composition are free of iodo or fluoro groups and may be in the range of 10 to 90%, or 15 to 75%, or 20 to 50% relative to the total polymer composition. A polymer useful for crosslinking is one which has groups that can crosslink with the groups in the novel polymer; one such polymer being a polyester polymer formed from the reaction of a dianhydride with a compound with at least 2 hydroxy groups or a compound with at least 2 carboxylic acid groups or at least one hydroxyl and at least one carboxylic acid groups. Such polymers are disclosed, and incorporated herein by reference, in patents with the numbers U.S. Pat. Nos. 7,638,262, 7,264,913, and US application with the Ser. No. 12/609,222 filed on Oct. 30, 2009. Another polymer useful as an additive for the novel composition and capable of increasing the dry etch rate of the film of the novel composition are disclosed, and incorporated herein by reference, in patent and application with the numbers U.S. Pat. No. 7,691,556 and US 2010/0009297. Examples of such polymers are glycoluril compounds reacted with diols, glycols, cyanuric compounds, etc. These secondary polymers are free of iodo or fluoro groups and can be copolymers formed by reacting an aminoplast. FIG. 8 shows examples of possible polymers which may be added to the composition in addition to the novel polymer.

The novel composition of the present invention comprises the novel polymer and may further comprise a crosslinker. Typically the crosslinker is a compound that can act as an electrophile and can, alone or in the presence of an acid, form a carbocation. Thus compounds containing groups such as alcohol, ether, ester, olefin, methoxymethylamino, methoxymethylphenyl and other molecules containing multiple electrophilic sites, are capable of crosslinking with the polymer. Polymeric crosslinkers may be used, such as polymers of glycoluril, melamine, etc. Examples of compounds which can be crosslinkers are, 1,3 adamantane diol, 1,3,5 adamantane triol, polyfunctional reactive benzylic compounds, tetramethoxymethyl-bisphenol (TMOM-BP) of structure (13), aminoplast crosslinkers, glycolurils, Cymels, Powderlinks, etc.

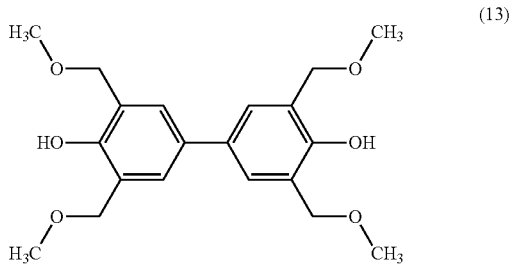

(13)

The novel composition comprising the polymer may also comprise an acid generator, and optionally a crosslinker. The acid generator can be a thermal acid generator capable of generating a strong acid upon heating. The thermal acid generator (TAG) used in the present invention may be any one or more that upon heating generates an acid which can react with the polymer and propagate crosslinking of the polymer present in the invention, particularly preferred is a strong acid such as a sulfonic acid. Preferably, the thermal acid generator is activated at above 90° C. and more preferably at above 120° C., and even more preferably at above 150° C. Examples of thermal acid generators are metal-free sulfonium salts and iodonium salts, such as triarylsulfonium, dialkylarylsulfonium, and diarylalkylsulfonium salts of strong non-nucleophilic acids, alkylaryliodonium, diaryliodonium salts of strong non-nucleophilic acids; and ammonium, alkylammonium, dialkylammonium, trialkylammonium, tetraalkylammonium salts of strong non nucleophilic acids. Also, covalent thermal acid generators are also envisaged as useful additives for instance 2-nitrobenzyl esters of alkyl or arylsulfonic acids and other esters of sulfonic acid which thermally decompose to give free sulfonic acids. Examples are diaryliodonium perfluoroalkylsulfonates, diaryliodonium tris(fluoroalkylsulfonyl)methide, diaryliodonium bis(fluoroalkylsulfonyl)methide, diaryliodonium bis(fluoroalkylsulfonyl)imide, diaryliodonium quaternary ammonium perfluoroalkylsulfonate. Examples of labile esters: 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; quaternary ammonium tris(fluoroalkylsulfonyl)methide, and quaternaryalkyl ammonium bis(fluoroalkylsulfonyl)imide, alkyl ammonium salts of organic acids, such as triethylammonium salt of 10-camphorsulfonic acid. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Preferably the TAG will have a very low volatility at temperatures between 170-220° C. Examples of TAGs are those sold by King Industries under Nacure and CDX names. Such TAG's are Nacure 5225, and CDX-2168E, which is a dodecylbenzene sulfonic acid amine salt supplied at 25-30% activity in propylene glycol methyl ether from King Industries, Norwalk, Conn. 06852, USA.

The novel composition may further optionally contain at least one of the known photoacid generators, examples of which without limitation, are onium salts, sulfonate compounds, nitrobenzyl esters, triazines, etc. The preferred photoacid generators are onium salts and sulfonate esters of hydoxyimides, specifically diphenyl iodonium salts, triphenyl sulfonium salts, dialkyl iodonium salts, triakylsulfonium salts, and mixtures thereof. These photoacid generators are not necessarily photolysed but are thermally decomposed to form an acid. The novel composition may be free of a photoacid generator.

The antireflection coating composition of the present invention may contain 10% weight % to about 100 weight % of the novel polymer, and preferably 40 weight % to about 80 weight %, of total solids in the composition. The optional crosslinker, when used in the composition, may be present at about 0.2 weight % to about 10 weight % of total solids. The thermal acid generator may be incorporated in a range from about 0 to about 5 weight % by total solids of the antireflective coating composition, preferably from 0.3 to 2 weight % by solids.

In one embodiment the novel composition comprises the novel polymer, a secondary polymer described herein, a crosslinker, a thermal acid generator, optional surfactant and solvent(s).

In one embodiment the novel composition comprises the novel polymer, a second polymer described herein, photo acid generator, a thermal acid generator, optional surfactant and solvent(s).

In one embodiment the novel composition is free of a thermal and/or photoacid generator and the novel polymer is self-crosslinking.

Examples of solvents for the coating composition include alcohols, esters, glymes, ethers, glycol ethers, glycol ether esters, ketones, lactones, cyclic ketones, and mixtures thereof. Examples of such solvents include, but are not limited to, propylene glycol methyl ether(PGME), propylene glycol methyl ether acetate(PGMEA), cyclohexanone, 2-heptanone, ethyl 3-ethoxy-propionate, ethyl lactate, gamma valerolactone, methyl 3-methoxypropionate, and mixtures thereof. The solvent is typically present in an amount of from about 40 to about 99.9 weight percent. In certain instances, the addition of lactone solvents is useful in helping flow characteristics of the antireflective coating composition when used in layered systems. When present, the lactone solvent comprises about 1 to about 10% of the solvent system. γ-valerolactone is a useful lactone solvent.

Since the antireflective film is coated on top of the substrate and is also subjected to dry etching, it is envisioned that the film is of sufficiently low metal ion level and of sufficient purity that the properties of the semiconductor device are not adversely affected. Treatments such as passing a solution of the polymer through an ion exchange column, filtration, and extraction processes can be used to reduce the concentration of metal ions and to reduce particles.

The absorption parameter (k) of the novel composition at 193 nm ranges from about 0.05 to about 1.0, preferably from about 0.1 to about 0.8 at the exposure wavelength, as derived from ellipsometric measurements. In one embodiment the composition has a k value in the range of about 0.2 to about 0.5 at the exposure wavelength. The refractive index (n) of the antireflective coating is also optimized and can range from about 1.3 to about 2.0, preferably 1.5 to about 1.8. The n and k values herein can be calculated using an ellipsometer, such as the J. A. Woollam WVASE VU-32™ Ellipsometer. The exact values of the optimum ranges for k and n are dependent on the exposure wavelength used and the type of application. As explained previously, 193 nm measurements are used as an indication of EUV parameters.

The antireflective coating composition is coated on the substrate using techniques well known to those skilled in the art, such as dipping, spin coating or spraying. The film thickness of the antireflective coating ranges from about 5 nm to about 100 nm, preferably 5-25 nm for EUV lithography The coating is further heated on a hot plate or convection oven for a sufficient length of time to remove any residual solvent and induce crosslinking, and thus insolubilizing the antireflective coating to prevent intermixing between the antireflective coating and the layer to be coated above it. The preferred range of temperature is from about 120° C. to about 280° C.

A film of photoresist is coated on top of the novel antireflective underlayer coating and baked to substantially remove the photoresist solvent. An edge bead remover may be applied after the coating steps to clean the edges of the substrate using processes well known in the art.

The substrates over which the antireflective coating is formed can be any of those typically used in the semiconductor industry. Suitable substrates include, without limitation, low dielectric constant materials, silicon, silicon substrate coated with a metal surface, copper coated silicon wafer, copper, aluminum, polymeric resins, silicon dioxide, metals, doped silicon dioxide, silicon nitride, tantalum, polysilicon, ceramics, aluminum/copper mixtures; gallium arsenide and other such Group III/V compounds. The substrate may comprise any number of layers made from the materials described above.

Photoresists can be any of the types used in the semiconductor industry, provided the photoactive compound in the photoresist and the antireflective coating substantially absorb at the exposure wavelength used for the imaging process.

To date, there are several major deep ultraviolet (uv) exposure technologies that have provided significant advancement in miniaturization, and these radiation of 248 nm, 193 nm, 157 and 13.5 nm. In the present invention exposure in EUV, 13.5 nm, is particularly suitable. The exposure source can range from 12 nm to 260 nm. Photoresists for 248 nm have typically been based on substituted polyhydroxystyrene and its copolymers/onium salts, such as those described in U.S. Pat. Nos. 4,491,628 and 5,350,660. On the other hand, photoresists for exposure at 193 nm and 157 nm require non-aromatic polymers since aromatics are opaque at this wavelength. U.S. Pat. Nos. 5,843,624 and 6,866,984 disclose photoresists useful for 193 nm exposure. Generally, polymers containing alicyclic hydrocarbons are used for photoresists for exposure from 100 to 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. Nos. 6,447, 980 and 6,723,488, and incorporated herein by reference. Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. Nos. 6,790,587, and 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (U.S. Pat. No. 6,818,258) or copolymerization of a fluorodiene with an olefin (U.S. Pat. No. 6,916,590). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type.

Photoresists that absorb extreme ultraviolet radiation (EUV) of 13.5 nm are especially useful and are known in the art. Such EUV photoresists are currently under development, but any suitable EUV photoresist may be used. The novel coatings can also be used in e-beam lithography, where exposure is conducted using electron beams.

After the coating process to form a film of the novel composition, the photoresist is imagewise exposed with a mask or e-beam. The exposure may be done using typical exposure equipment. Examples of exposure wavelength sources are 13.5 nm, although any source may be used. The exposed photoresist is then developed in an aqueous developer to remove the treated photoresist. The developer is preferably an aqueous alkaline solution comprising, for example, tetramethyl ammonium hydroxide (TMAH). Example of a developer is 0.26N aqueous tetramethyl ammonium hydroxide (TMAH) solution. Development may be for 60 seconds. The developer may further comprise surfactant(s). An optional heating step can be incorporated into the process prior to development and after exposure. The development forms a photoresist pattern over the novel underlayer film which is not removed during the development step.

The process of coating and imaging photoresists is well known to those skilled in the art and is optimized for the specific type of photoresist used. The patterned substrate can then be dry etched with an etching gas or mixture of gases, in a suitable etch chamber to remove the exposed portions of the antireflective film or multiple layers of antireflective coatings, with the remaining photoresist acting as an etch mask. Various etching gases are known in the art for etching organic antireflective coatings, such as those comprising $O_2$, $CF_4$, $CHF_3$, $Cl_2$, HBr, $SO_2$, CO, etc.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the absorption (k) values of the carbon hard mask antireflective coating in the Examples below were measured on a J. A. Woollam VASE32 ellipsometer.

The molecular weight of the polymers was measured on a Gel Permeation Chromatograph.

Example 1

30 grams of tetramethoxymethyl glycoluril, 5.3 grams of 4-fluorophenol, 30 ml of tetrahydrofuran(THF) and 40 ml of propylene glycol methyl ether acetate (PGMEA) were charged into a flask with a thermometer, mechanical stirrer and a cold water condenser. After a catalytic amount of para-toluenesulfonic acid monohydrate (0.35 g) was added, the reaction was maintained at 80° C. for 4 hrs. The reaction solution was then cooled to room temperature and filtered. The filtrate was slowly poured into distilled water while stirring to precipitate the polymer. The polymer was collected by filtration. After drying, the polymer was re-dissolved in THF and precipitated in water. The polymer was filtered, washed thoroughly with water and dried in a vacuum oven. 13.2 g of polymer product was obtained with a weight average molecular weight of about 8,100 g/mol. Fluorine content in the polymer was 2.0% as determined by elemental analysis.

Example 2

30 grams of tetramethoxymethyl glycoluril, 10.4 grams of 4-iodophenol, 40 ml of THF and 40 ml of PGMEA were charged into a flask with a thermometer, mechanical stirrer and a cold water condenser. After a catalytic amount of para-toluenesulfonic acid monohydrate (0.35 g) was added, the reaction was maintained at 80° C. for about 7 hrs. The reaction solution was then cooled to room temperature and filtered. The filtrate was slowly poured into distilled water while stirring to precipitate the polymer. The polymer was collected by filtration. After drying, the polymer was re-dissolved in THF and precipitated in water. The polymer was filtered, washed thoroughly with water and dried in a vacuum oven. 18.0 g of the polymer product was obtained with a weight average molecular weight of about 2,200 g/mol. Iodine in the polymer was 21.1% as determined by elemental analysis.

Example 3

30 grams of tetramethoxymethyl glycoluril, 10.4 grams of 3-iodophenol, 40 ml of THF and 40 ml of PGMEA were charged into a flask with a thermometer, mechanical stirrer and a cold water condenser. After a catalytic amount of para-toluenesulfonic acid monohydrate (0.3 g) was added, the reaction was maintained at 80° C. for about 7 hrs. The reaction solution was then cooled to room temperature and filtered. The filtrate was slowly poured into distilled water while stirring to precipitate the polymer. The polymer was collected by filtration. After drying, the polymer was re-dissolved in THF and precipitated in water. The polymer was filtered, washed thoroughly with water and dried in a vacuum oven. 24.0 g of polymer product was obtained with a weight average molecular weight of about 3,500 g/mol. Iodine in the polymer was 21.7% as determined by elemental analysis. The EUV absorption was calculated to be 7.7/g based on elemental analysis of the polymer and by assigning a known atomic absorption value given in literature to each atom in the polymer.

Example 4

20 grams of tetramethoxymethyl glycoluril, 6.9 grams of 3-iodophenol, 2.9 grams of 3,4,5-trimethoxyphenol, 30 ml of THF and 30 ml of PGMEA were charged into a flask with a thermometer, mechanical stirrer and a cold water condenser. After a catalytic amount of para-toluenesulfonic acid monohydrate (0.2 g) was added, the reaction was maintained at 80° C. for about 5.5 hrs. The reaction solution was then cooled to room temperature and filtered. The filtrate was slowly poured into distilled water while stirring to precipitate the polymer. The polymer was collected by filtration. After drying, the polymer was re-dissolved in THF and precipitated in water. The polymer was filtered, washed thoroughly with water and dried in a vacuum oven. 18.0 g of polymer product was obtained with a weight average molecular weight of about 2,400 g/mol.

Example 5

30 grams of tetramethoxymethyl glycoluril, 8.2 grams of 3,5-difluorophenol, 40 ml of THF and 40 ml of PGMEA were charged into a flask with a thermometer, mechanical stirrer and a cold water condenser. After a catalytic amount of para-toluenesulfonic acid monohydrate (0.3 g) was added, the reaction was maintained at 80° C. for about 8 hrs. The reaction solution was then cooled to room temperature and filtered. The filtrate was slowly poured into distilled water while stirring to precipitate the polymer. The polymer was collected by filtration. After drying, the polymer was re-dissolved in THF and precipitated in water. The polymer was filtered, washed thoroughly with water and dried in a vacuum oven. 18.0 g of polymer product was obtained with a weight average molecular weight of about 6200 g/mol. Fluorine content of the polymer was 7.1% as determined by elemental analysis. The EUV absorption was calculated to be 1.57/g based on elemental analysis of the polymer and by assigning a known atomic absorption value given in literature to each atom in the polymer.

Example 6

30 grams of tetramethoxymethyl glycoluril, 7.6 grams of 4-trifluoromethylphenol, 30 ml of THF and 50 ml of PGMEA were charged into a flask with a thermometer, mechanical stirrer and a cold water condenser. After a catalytic amount of para-toluenesulfonic acid monohydrate (0.3 g) was added, the reaction was maintained at 80° C. for about 7 hrs. The reaction solution was then cooled to room temperature and filtered. The filtrate was slowly poured into distilled water while stirring to precipitate the polymer. The polymer was collected by filtration. After drying, the polymer was re-dissolved in THF and precipitated in water. The polymer was filtered, washed thoroughly with water and dried in a vacuum oven. 17.0 g of polymer product was obtained with a weight average molecular weight of about 14,500 g/mol. Fluorine content of the polymer was 5.3% as determined by elemental analysis.

Example 7

20 grams of tetramethoxymethyl glycoluril, 6.9 grams of 3-iodophenol, 2.0 grams of 2,5-dimethylphenol, 30 ml of THF and 30 ml of PGMEA were charged into a flask with a thermometer, mechanical stirrer and a cold water condenser. After a catalytic amount of para-toluenesulfonic acid monohydrate (0.2 g) was added, the reaction was maintained at 80° C. for about 4.5 hrs. The reaction solution was then cooled to room temperature and filtered. The filtrate was slowly poured into distilled water while stirring to precipitate the polymer. The polymer was collected by filtration. After drying, the polymer was re-dissolved in THF and precipitated in water. The polymer was filtered, washed thoroughly with water and dried in a vacuum oven. 17.7 g of polymer product was obtained with a weight average molecular weight of about 5100 g/mol. The EUV absorption was calculated to be 7.0/g based on elemental analysis of the polymer and by assigning a known atomic absorption value given in literature to each atom in the polymer.

Example 8

30 grams of tetramethoxymethyl glycoluril, 10.8 grams of 3,5-bis(trifluoromethyl)phenol, 2.9 grams of 2,5-dimethylphenol, 30 ml of THF and 50 ml of PGMEA were charged into a flask with a thermometer, mechanical stirrer and a cold water condenser. After a catalytic amount of para-toluenesulfonic acid monohydrate (0.25 g) was added, the reaction was maintained at 80° C. for about 4.5 hrs. The reaction solution was then cooled to room temperature and filtered. The filtrate was slowly poured into distilled water while stirring to precipitate the polymer. The polymer was collected by filtration. After drying, the polymer was re-dissolved in THF and precipitated in water. The polymer was filtered, washed thoroughly with water and dried in a vacuum oven. 21.0 g of polymer product was obtained with a weight average molecular weight of about 10,000 g/mol. Fluorine content of the polymer was 12.5% as determined by elemental analysis.

Example 9

30 grams of tetramethoxymethyl glycoluril, 10.4 grams of 3-iodophenol, 3.7 grams of 4-acetylresorcinol, 40 ml of THF and 40 ml of PGMEA were charged into a flask with a thermometer, mechanical stirrer and a cold water condenser. After a catalytic amount of para-toluenesulfonic acid monohydrate (0.3 g) was added, the reaction was maintained at 80° C. for about 6 hrs. The reaction solution was then cooled to room temperature and filtered. The filtrate was slowly poured into distilled water while stirring to precipitate the polymer. The polymer was collected by filtration. After drying, the polymer was re-dissolved in THF and precipitated in water. The polymer was filtered, washed thoroughly with water and dried in a vacuum oven. 26.0 g of polymer product was obtained with a weight average molecular weight of about 3,900 g/mol.

Example 10

20 grams of tetramethoxymethyl glycoluril, 6.0 grams of 3-iodophenol, 4.9 grams of 3,5-dimethyl 4-iodophenol, 30 ml of THF and 30 ml of PGMEA were charged into a flask with a thermometer, mechanical stirrer and a cold water condenser. After a catalytic amount of para-toluenesulfonic acid monohydrate (0.2 g) was added, the reaction was maintained at 80° C. for about 5 hrs. The reaction solution was then cooled to room temperature and filtered. The filtrate was slowly poured into distilled water while stirring to precipitate the polymer. The polymer was collected by filtration. After drying, the polymer was re-dissolved in THF and precipitated in water. The polymer was filtered, washed thoroughly with water and dried in a vacuum oven. 21.0 g of polymer product was obtained with a weight average molecular weight of about 3,800 g/mol.

Example 11

10 g of butanetetracarboxylic acid dianhydride, 7 g of styrene glycol, 0.5 g of benzyltributylammonium chloride, and 35 g of propyleneglycol monomethyletheracetate (PGMEA) were charged into a flask with a condenser, thermal controller and a mechanical stirrer. Under nitrogen and stirring, the mixture was heated to 110° C. A clear solution was obtained after ~1-2 hours. The temperature was kept at 110° C. for 3 hours. Upon cooling, 60 g of PGMEA and 36 g of propylene oxide were mixed with the above solution. The reaction was kept at 50° C. for 48 hrs. The reaction solution was cooled to room temperature and slowly poured into a large amount of water in a high-speed blender. The polymer was collected and washed thoroughly with water. Finally, the polymer was dried in a vacuum oven. 16 g of polymer was obtained with an average molecular weight (MW) of about 20,000 g/mol.

Example 12

110 g of tetramethoxymethyl glycoluril and 61 g of tris(2-hydroxyethyl)cyanuric acid were added in 350 g of dioxane. The temperature was raised to 92-94° C. and a clear solution was obtained. 0.7 g of paratoluenesulfonic acid (PTSA) was added and the reaction was allowed for 6 hours at reflux. After cooling down to room temperature, 0.5 g triethyl amine was added. The solution was precipitated in n-butyl acetate at 5° C. The polymer was filtered and dried under vacuum. The polymer obtained had a weight average molecular weight of about 2,200 g/mol.

Example 13

Evaluation of Resistance to Solvents and Developer for Underlayer Films made from polymers in synthesis examples 1-9.

A solution of the polymer from Synthesis Example 1 was made in 70/30 PGMEA/PGME. The solution was spin coated on silicon wafers and baked at 200° C./60 s to give a film. PGMEA/PGME 70/30 solvent was dispensed for 60 s on the silicon wafer coated with underlayer material from polymer solution of Synthesis Example 1. The solvent was removed by nitrogen blowing. No significant film loss was observed after the solvent treatment. Similar experiment were performed using AZ® 300 MIF developer (0.26N tetramethylammonium hydroxide in water) instead of solvent mixture. The above EUV underlayer film demonstrated good resistance to developer.

The above experiments were repeated with polymer solutions made by polymers from Synthesis Example 2-9 in PGMEA/PGME 70/30. The EUV underlayer films had good resistance to both casting solvent and developer. No film loss of the underlayer was observed after the solvent treatment or the developer treatment.

Example 14

1.71 g of polymer from Synthesis Example 12, 0.73 g of product from Synthesis Example 11 and 0.49 g of product from Synthesis Example 2 was dissolved in 287 g of PGMEA/PGME 70/30 solvent and 8.9 g gamma-valerolactone to make a 1.0 wt % solution. The mixture then was filtered through a micro filter with a pore size of 0.2 um. The solution was diluted to obtain the desired film thickness with same solvents then spin-coated on a silicon wafer for 40 seconds. The coated wafer was then heated on a hot plate for 1 minute at 200° C.

Example 15

0.6 g of product from Synthesis Example 11 and 1.4 g of product from Synthesis Example 5 was dissolved in 192 g of PGMEA/PGME 70/30 solvent and 5.9 g gamma-valerolactone to make a 1.0 wt % solution. The mixture then was filtered through a micro filter with a pore size of 0.2 um. The solution was diluted to obtain the desired film thickness with same solvents then spin-coated on a silicon wafer for 40 seconds. The coated wafer was then heated on a hot plate for 1 minute at 200° C.

Example 16

0.6 g of polymer from Synthesis Example 12, 0.6 g of product from Synthesis Example 11 and 0.8 g of product from Synthesis Example 3 was dissolved in 192 g of PGMEA/PGME 70/30 solvent and 5.9 g gamma-valerolactone to make a 1.0 wt % solution. The mixture then was filtered through a micro filter with a pore size of 0.2 um. The solution was diluted to obtain the desired film thickness with same solvents then spin-coated on a silicon wafer for 40 seconds. The coated wafer was then heated on a hot plate for 1 minute at 200° C.

Example 17

0.6 g of product from Synthesis Example 11 and 1.4 g of product from Synthesis Example 8 was dissolved in 192 g of PGMEA/PGME 70/30 solvent and 5.9 g gamma-valerolactone to make a 1.0 wt % solution. The mixture then was filtered through a micro filter with a pore size of 0.2 um. The solution was diluted to obtain the desired film thickness with same solvents then spin-coated on a silicon wafer for 40 seconds. The coated wafer was then heated on a hot plate for 1 minute at 200° C.

Example 18

0.6 g of product from Synthesis Example 11 and 1.4 g of product from Synthesis Example 9 was dissolved in 192 g of PGMEA/PGME 70/30 solvent and 5.9 g gamma-valerolactone to make a 1.0 wt % solution. The mixture then was filtered through a micro filter with a pore size of 0.2 um. The solution was diluted to obtain the desired film thickness with same solvents then spin-coated on a silicon wafer for 40 seconds. The coated wafer was then heated on a hot plate for 1 minute at 200° C.

Example 19

1.71 g of polymer from Synthesis Example 12, 0.73 g of product from Synthesis Example 11 and 0.49 g of product from Synthesis Example 2 was dissolved in 287 g of PGMEA/PGME 70/30 solvent and 8.9 g gamma-valerolactone to make a 1.0 wt % solution. A mixture of 0.073 g of 10% of dodecylbenzene sulfonic acid triethylamine salt in PGMEA/PGME 70/30, 0.073 g of 10% of nonafluorobutanesulfonic acid triethylamine salt in PGMEA/PGME 70/30 was added in the polymer solution. The mixture then was filtered through a micro filter with a pore size of 0.2 um. The solution was diluted to obtain the desired film thickness with same solvents then spin-coated on a silicon wafer for 40 seconds. The coated wafer was then heated on a hot plate for 1 minute at 200° C. The measured optical parameters are 1.83 for refractive index (n) and 0.29 for absorption (k) at at 193 nm.

Example 20

0.6 g of product from Synthesis Example 11 and 1.4 g of product from Synthesis Example 5 was dissolved in 192 g of PGMEA/PGME 70/30 solvent and 5.9 g gamma-valerolactone to make a 1.0 wt % solution. A mixture of 0.06 g of 10% of dodecylbenzene sulfonic acid triethylamine salt in PGMEA/PGME 70/30, 0.06 g of 10% of nonafluorobutanesulfonic acid triethylamine salt in PGMEA/PGME 70/30 was added in the polymer solution. The mixture then was filtered through a micro filter with a pore size of 0.2 um. The solution was diluted to obtain the desired film thickness with same solvents then spin-coated on a silicon wafer for 40 seconds. The coated wafer was then heated on a hot plate for 1 minute at 200° C. The measured optical parameters are 1.76 for refractive index (n) and 0.37 for absorption (k) at at 193 nm.

Example 21

0.6 g of polymer from Synthesis Example 12, 0.6 g of product from Synthesis Example 11 and 0.8 g of product from Synthesis Example 3 was dissolved in 192 g of PGMEA/PGME 70/30 solvent and 5.9 g gamma-valerolactone to make a 1.0 wt % solution. A mixture of 0.06 g of 10% of dodecylbenzene sulfonic acid triethylamine salt in PGMEA/PGME 70/30, 0.06 g of 10% of nonafluorobutanesulfonic acid triethylamine salt in PGMEA/PGME 70/30 was added in the polymer solution. The mixture then was filtered through a micro filter with a pore size of 0.2 um. The solution was diluted to obtain the desired film thickness with same solvents then spin-coated on a silicon wafer for 40 seconds. The coated wafer was then heated on a hot plate for 1 minute at 200° C.

Example 22

0.6 g of product from Synthesis Example 11 and 1.4 g of product from Synthesis Example 7 was dissolved in 192 g of PGMEA/PGME 70/30 solvent and 5.9 g gamma-valerolactone to make a 1.0 wt % solution. A mixture of 0.06 g of 10% of dodecylbenzene sulfonic acid triethylamine salt in PGMEA/PGME 70/30, 0.06 g of 10% of nonafluorobutanesulfonic acid triethylamine salt in PGMEA/PGME 70/30 was added in the polymer solution. The mixture then was filtered through a micro filter with a pore size of 0.2 um. The solution was diluted to obtain the desired film thickness with same solvents then spin-coated on a silicon wafer for 40 seconds. The coated wafer was then heated on a hot plate for 1 minute at 200° C. The measured optical parameters are 1.72 for refractive index (n) and 0.33 for absorption (k) at at 193 nm.

Example 23

0.6 g of product from Synthesis Example 11 and 1.4 g of product from Synthesis Example 9 was dissolved in 192 g of PGMEA/PGME 70/30 solvent and 5.9 g gamma-valerolactone to make a 1.0 wt % solution. A mixture of 0.06 g of 10% of dodecylbenzene sulfonic acid triethylamine salt in PGMEA/PGME 70/30, 0.06 g of 10% of nonafluorobutanesulfonic acid triethylamine salt in PGMEA/PGME 70/30 was added in the polymer solution. The mixture then was filtered through a micro filter with a pore size of 0.2 um. The solution was diluted to obtain the desired film thickness with same solvents then spin-coated on a silicon wafer for 40 seconds. The coated wafer was then heated on a hot plate for 1 minute at 200° C. The measured optical parameters are 1.76 for refractive index (n) and 0.30 for absorption (k) at at 193 nm.

Example 24

0.6 g of product from Synthesis Example 11 and 1.4 g of product from Synthesis Example 5 was dissolved in 192 g of PGMEA/PGME 70/30 solvent and 5.9 g gamma-valerolactone to make a 1.0 wt % solution. 0.2 g of 10% of triethylamine in PGMEA/PGME 70/30 was added in the polymer solution. The mixture then was filtered through a micro filter with a pore size of 0.2 um. The solution was diluted to obtain the desired film thickness with same solvents then spin-coated on a silicon wafer for 40 seconds. The coated wafer was then heated on a hot plate for 1 minute at 200° C.

Example 25

0.6 g of product from Synthesis Example 11 and 1.4 g of product from Synthesis Example 7 was dissolved in 192 g of PGMEA/PGME 70/30 solvent and 5.9 g gamma-valerolactone to make a 1.0 wt % solution. 0.2 g of 10% of triethylamine in PGMEA/PGME 70/30 was added in the polymer solution. The mixture then was filtered through a micro filter with a pore size of 0.2 um. The solution was diluted to obtain the desired film thickness with same solvents then spin-coated on a silicon wafer for 40 seconds. The coated wafer was then heated on a hot plate for 1 minute at 200° C.

Example 26

Evaluation of Resistance to Solvents and Developer for underlayer Films made from formulation examples 14-25.

PGMEA/PGME 70/30 solvent was dispensed individually on the coated and baked silicon wafers from Examples 14-25. The solvent was removed by nitrogen blowing after 60 s of dispense. No significant film losses were observed in the solvent. Similar experiments were performed with AZ® 300 MIF developer. The above EUV underlayer film demonstrated good resistance to developer. No significant film losses were observed in the developer.

The films did not dissolve in the solvent or the developer showing good crosslinking. The underlayer was also successfully crosslinked with and without the thermal acid generator.

In Examples 24 and 25, where a base was added to the underlayer formulation, sufficient crosslinking was present despite the presence of a base. This shows that even if base poisoning from the substrate is present, the underlayer coating can still be functional.

Example 27

The underlayer solution of Example 20 was filtered using a 0.2 um nylon syringe filter. The sample was then coated on an 8" silicon wafer and post application baked at 200° C./60seconds. EUV SEVR-139 photoresist (available from SEMATECH, University of Albany, New York) was coated on top of the underlayer. It was baked and exposed at SEMATECH using their 0.3NA (numerical aperture) Albany Exitech micro-exposure EUV tool (eMET). After development, the lithographic performance was evaluated with both a CD scanning electron microscope (CDSEM) topdown measurement and cross section pictures taken under an SEM microscope. The 30 nm half pitch pattern showed good photoresist pattern profiles with minimal footing and clean lines without scumming. The EUV lithography was shown to have excellent photosensitivity of 30 nm 1:1 LIS at 11.7 mJ/cm$^2$. The pattern also had good collapse margin, depth of focus and process window.

Example 28

The underlayer solution of Example 22 was filtered using a 0.2 um nylon syringe filter. The sample was then coated on an 8" silicon wafer and post application baked at 200° C./60 seconds. EUV SEVR-139 photoresist was coated on top of underlayer. It was baked and exposed at SEMATECH using their 0.3NA (numerical aperture) Albany Excimer micro-exposure EUV tool (eMET). After development, the lithographic performance was evaluated with both CDSEM topdown measurements and cross section pictures taken under an SEM microscope. The 30 nm half pitch showed good photoresist pattern profiles with minimal footing and clean lines without scumming. The EUV lithography was shown to have excellent photosensitivity of 30 nm 1:1 US at 11.7 mJ/cm$^2$. The pattern also had good collapse margin, depth of focus and process window.

The invention claimed is:

1. An underlayer coating composition comprising a polymer, where the polymer comprises at least one hydroxyaromatic unit in the backbone of the polymer comprising a fluoro or iodo moiety, and at least one unit comprising an aminoplast, further where the hydroxyaromatic unit with the fluoro moiety has structure (1),

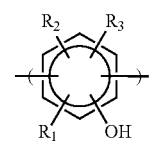

(1)

where, $R_1$ is fluoro moiety, $R_2$ is fluoro moiety and $R_3$ is selected from a group consisting of an iodo moiety, a fluoro moiety, hydrogen, hydroxyl, ($C_1$-$C_4$)alkyl, hydroxy($C_1$-$C_4$)alkyl, $OC_1$-$C_4$alkyl, (C=O)($C_1$-$C_4$)alkyl, $C_1$-$C_4$alkylO($C_1$-$C_4$)alkyl, $C_1$-$C_4$alkyl(C=O)($C_1$-$C_4$)alkyl and C(O)O($C_1$-$C_4$)alkyl.

2. The composition of claim 1, where the fluoro moiety is selected from F, $C_1$-$C_4$fluoroalkyl, $C_1$-$C_4$ hydroxyfluoroalkyl, $OC_1$-$C_4$fluoroalkyl C(O)($C_1$-$C_4$)fluoroalkyl, and C(O)O($C_1$-$C_4$)fluoroalkyl.

3. The composition of claim 1, where the unit comprising an aminoplast is derived from a glycoluril monomer.

4. The composition of claim 1, where the unit comprising an aminoplast is derived from a urea/formaldehyde oligomer.

5. The composition of claim 1, where the polymer further comprises a phenolic unit free of a fluoro or iodo moiety.

6. The composition of claim 1, where the composition further comprises a thermal acid generator.

7. The composition of claim 1, where the composition further comprises a polyester polymer.

8. The composition of claim 1, where the composition further comprises a glycoluril polymer different from the polymer of claim 1.

9. The composition of claim 1, wherein the hydroxyaromatic unit is naphthol.

10. The composition of claim 1 further comprising a solvent.

11. The composition of claim 1 further comprising a secondary polymer.

12. The composition or polymer of claim 1 having a fluoro or iodo content in the range of 1% to 30% by weight.

13. The composition of claim 1, where the hydroxyaromatic unit is derived from

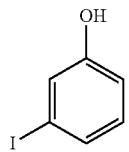 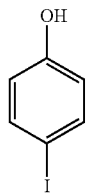 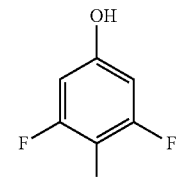

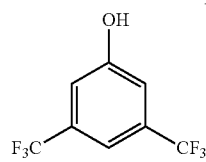 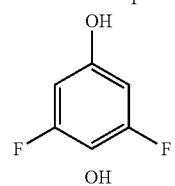

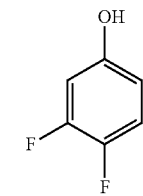

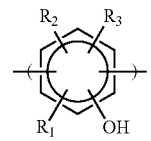

14. The composition of claim 1, where the composition is free of an external crosslinker.

15. A process for manufacturing a microelectronic device, comprising;
   a) providing a substrate with a layer of an underlayer coating composition from claim 1;
   b) coating a photoresist layer above the underlayer coating;
   c) imagewise exposing the photoresist layer;
   d) developing the photoresist layer with an aqueous alkaline developing solution.

16. The process of claim 15, where the underlayer coating layer has k value in the range of about 0.05 to about 1.0.

17. The process of claim 15, where the underlayer coating layer has k value in the range of about 0.05 to about 0.5.

18. The process of claim 15, where the photoresist is imageable with radiation from about 260 nm to about 12 nm.

19. The process according to claim 15, where the developing solution is an aqueous solution comprising a hydroxide base.

20. The composition of claim 1, where the hydroxyaromatic unit with the iodo moiety has structure (1), (1)

where, $R_1$ is selected from an iodo moiety, $R_2$ and $R_3$ are independently selected from an iodo moiety, a fluoro moiety, hydrogen, hydroxyl, ($C_1$-$C_4$)alkyl, hydroxy($C_1$-$C_4$)alkyl, $OC_1$-$C_4$alkyl, (C=O)($C_1$-$C_4$)alkyl, $C_1$-$C_4$alkylO($C_1$-$C_4$)alkyl, $C_1$-$C_4$alkyl(C=O)($C_1$-$C_4$)alkyl, C(O)O($C_1$-$C_4$)alkyl and $R_2$ and $R_3$ are connected to form hydroxyaromatic ring fused to the phenol.

* * * * *